(12) United States Patent
Long et al.

(10) Patent No.: US 9,748,280 B2
(45) Date of Patent: Aug. 29, 2017

(54) THIN FILM TRANSISTOR AND METHOD OF FABRICATING THE SAME, ARRAY SUBSTRATE AND METHOD OF FABRICATING THE SAME, AND DISPLAY DEVICE

(71) Applicant: BOE TECHNOLOGY GROUP CO., LTD., Beijing (CN)

(72) Inventors: Chunping Long, Beijing (CN); Zuqiang Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/768,009

(22) PCT Filed: Jan. 8, 2015

(86) PCT No.: PCT/CN2015/070327
§ 371 (c)(1),
(2) Date: Aug. 14, 2015

(87) PCT Pub. No.: WO2016/041304
PCT Pub. Date: Mar. 24, 2016

(65) Prior Publication Data
US 2016/0254285 A1  Sep. 1, 2016

(30) Foreign Application Priority Data

Sep. 16, 2014 (CN) .......................... 2014 1 0473273

(51) Int. Cl.
*H01L 29/786* (2006.01)
*H01L 27/12* (2006.01)
(Continued)

(52) U.S. Cl.
CPC ........ *H01L 27/1244* (2013.01); *G02F 1/1368* (2013.01); *H01L 27/1222* (2013.01);
(Continued)

(58) Field of Classification Search
None
See application file for complete search history.

(56) References Cited

U.S. PATENT DOCUMENTS 6,232,158 B1 * 5/2001 Lee ................... H01L 29/41733
257/E21.414
8,257,992 B2 * 9/2012 Yeh ..................... H01L 27/1225
438/104

(Continued)

FOREIGN PATENT DOCUMENTS

CN    102651339 A    8/2012
CN    202601619 U    12/2012

OTHER PUBLICATIONS

Form PCT/ISA/237 issued in International application No. PCT/CN2015/070327 dated Jun. 19, 2015.
(Continued)

*Primary Examiner* — Johannes P Mondt
(74) *Attorney, Agent, or Firm* — Nath, Goldberg & Meyer; Joshua B. Goldberg; Annie Kock

(57) ABSTRACT

The present invention provides a thin film transistor and a method of fabricating the same, an array substrate and a method of fabricating the same, and a display device. The thin film transistor comprises a gate, a source, a drain, a gate insulation layer, an active layer, a passivation layer, a first electrode connection line and a second electrode connection line. The gate, the source and the drain are provided in the same layer and comprise the same material. The gate insulation layer is provided above the gate, the active layer is provided above the gate insulation layer, and a pattern of the gate insulation layer, a pattern of the gate and a pattern of the active layer coincide with each other. The passivation layer covers the source, the drain and the active layer, and the passivation layer has a first via hole corresponding to a position of the source, a second via hole corresponding to a (Continued)

position of the drain, and a third via hole and a fourth via hole corresponding to a position of the active layer provided therein. The first electrode connection line connects the source with the active layer through the first via hole and the third via hole, and the second electrode connection line connects the drain with the active layer through the second via hole and the fourth via hole.

10 Claims, 6 Drawing Sheets

(51) Int. Cl.
    *G02F 1/1368* (2006.01)
    *H01L 29/49* (2006.01)
    *H01L 27/32* (2006.01)

(52) U.S. Cl.
    CPC ...... *H01L 27/1274* (2013.01); *H01L 29/4908* (2013.01); *H01L 29/786* (2013.01); *H01L 29/78618* (2013.01); *H01L 29/78675* (2013.01); *G02F 2001/13685* (2013.01); *H01L 27/3262* (2013.01)

(56) References Cited

U.S. PATENT DOCUMENTS

2009/0159887 A1    6/2009  Huh et al.
2012/0052636 A1*  3/2012  Shin .................. H01L 29/66742
                                                  438/151

OTHER PUBLICATIONS

ISR issued in International application No. PCT/CN2015/070327 dated Sep. 16, 2014.
1st Office Action, dated Sep. 1, 2016, for counterpart CN201410473273.8, with English translation.

* cited by examiner

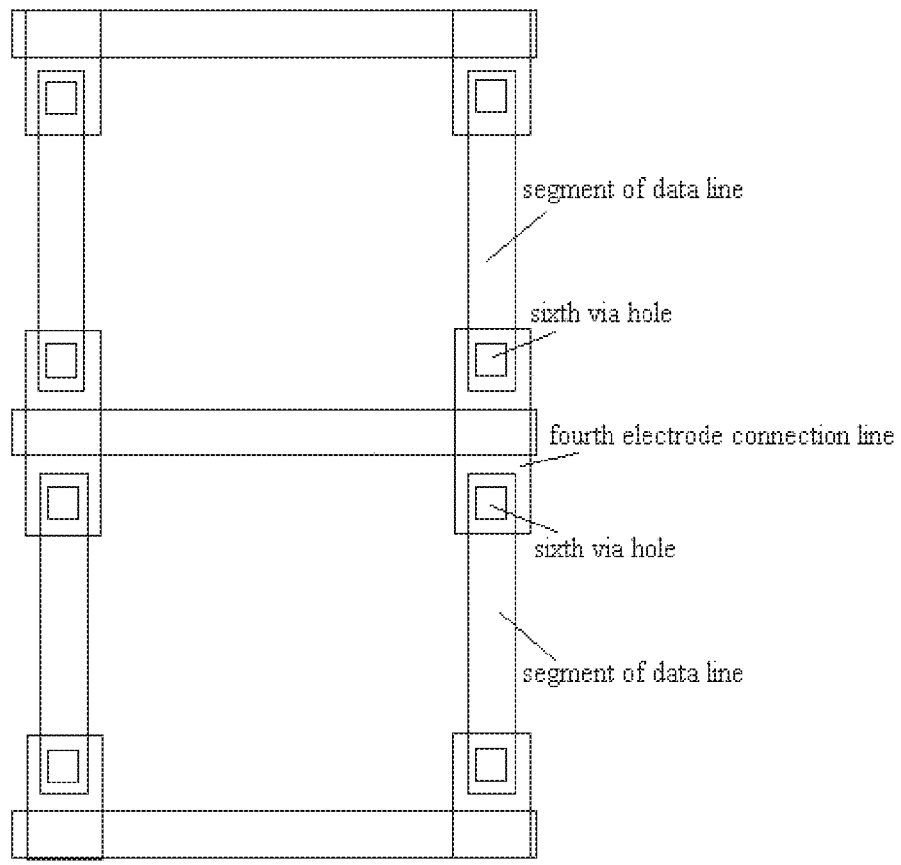

THIN FILM TRANSISTOR AND METHOD OF FABRICATING THE SAME, ARRAY SUBSTRATE AND METHOD OF FABRICATING THE SAME, AND DISPLAY DEVICE

This is a National Phase Application filed under 35 U.S.C. 371 as a national stage of PCT/CN2015/070327, filed Jan. 8, 2015, an application claiming the benefit of Chinese Application No. 201410473273.8, filed Sep. 16, 2014, the content of each of which is hereby incorporated by reference in its entirety.

FIELD OF THE INVENTION

The present invention relates to the field of display technology, and particularly relates to a low-temperature polysilicon thin film transistor and a method of fabricating the same, an array substrate and a method of fabricating the same, and a display device.

BACKGROUND OF THE INVENTION

An organic light emitting diode display has advantages of high response speed, light weight, flexible and wide viewing angle with respect to a liquid crystal display. An active matrix organic light emitting diode (AMOLED) has advantages of low driving current and low power consumption, and is suitable for high-resolution display. The architecture of the active matrix organic light emitting diode may be driven by using amorphous silicon, polysilicon, oxide semiconductor or organic thin film transistor, since a carrier mobility and a driving current of amorphous silicon or organic thin film transistor are small, a voltage required for driving high-luminance organic light emitting diode is high and a generated device size is large. However, the low-temperature polysilicon has the mobility up to 100 $cm^2/V \cdot s$, the high current characteristic of the low-temperature polysilicon meets stringent requirement for the organic light emitting diode, and the driving scheme with low operating voltage and high density facilitates longer lifetime of the organic light emitting diode. Different from a voltage driving scheme of conventional liquid crystal display, the driving for the organic light emitting diode requires a special current driving scheme, and two to six thin film transistors are generally required to be provided in a same pixel so as to achieve a compensation circuit involving uniformities of grayscale and panel. High-density layout characteristic of the low-temperature polysilicon thin film transistors facilitates implementation of the organic light emitting diode panel with high luminance and high definition. Currently, most of the AMOLED displays through successful commercial production utilize the array substrate having the low-temperature polysilicon.

In the process of fabricating conventional low-temperature polysilicon array substrate, eight to nine exposing processes are generally required. The process of fabricating the low-temperature polysilicon array substrate shown in FIG. 1 in the prior art will be described below.

A buffer layer 2 of silicon dioxide ($SiO_2$) and silicon nitride (SiN) films is formed on entire substrate 1 by plasma enhanced chemical vapor deposition (PECVD). Then, amorphous silicon (a-Si) film is formed on the buffer layer 2 by PECVD or other chemical (or physical) vapor deposition. The a-Si film is crystallized into polysilicon film by laser annealing (ELA) or solid phase crystallization (SPC). A polysilicon active layer 3 is then formed by using conventional exposing and etching processes. Low-concentration ion doping is performed by using ion implantation process, so as to form a semiconductor active region required by the thin film transistor in the polysilicon active layer 3.

A gate insulation layer 4 is formed by depositing $SiO_2$ film or $SiO_2$ and SiN films by PECVD on the substrate 1 on which the active layer 3 is formed. One or more metal material films with low resistance are deposited on the gate insulation layer 4 by physical vapor deposition such as magnetron sputtering, and a gate 5 is formed by photolithography process.

A passivation layer 6 and via holes for connecting a source 7 and a drain 8 with the active layer 3 are formed on the substrate 1 on which the gate 5 is formed, by depositing $SiO_2$ and SiN films by PECVD, and by exposing and etching processes.

One or more metal films with low resistance are deposited by magnetron sputtering, and the source 7 and the drain 8 are formed by exposing and etching processes, the source 7 and the drain 8 are in ohmic contact with the polysilicon active layer 3 through the corresponding via holes, respectively.

A planarization layer 9 is formed by PECVD on the substrate 1 subjected to above steps, and via holes are formed by patterning process.

A layer of transparent conductive film is formed by magnetron sputtering on the substrate 1 subjected to above steps, and a pixel electrode 10 of pixel region is formed by photolithography process.

A pattern comprising a pixel defining layer 11 is formed by patterning process on the substrate 1 subjected to above steps.

As can be seen from above, at least six to seven photolithography processes are required to form the structure of the low-temperature polysilicon array substrate shown in FIG. 1, resulting in long process time and low process yield, so that fabrication cost of the array substrate is high. Further, the inventor finds that, since excess silicon atoms migrate to portions between the grains during crystallization, the polysilicon film has convex portions at grain boundary regions, resulting in high-roughness upper surface of the polysilicon film and rough interface between the polysilicon active layer 3 and the gate insulation layer 4, so that performance of the thin film transistor is degraded and process failure is produced.

SUMMARY OF THE INVENTION

To solve the technical problem of high fabricating cost of the low-temperature polysilicon array substrate in the prior art, the present invention provides a low-temperature polysilicon thin film transistor and a method of fabricating the same, an array substrate comprising the low-temperature polysilicon thin film transistor and a method of fabricating the same, and a display device comprising the array substrate, which have a simple fabricating process and a low fabricating cost.

The embodiments of the present invention provide a low-temperature polysilicon thin film transistor, comprising a gate, a source, a drain, a gate insulation layer, an active layer, a passivation layer, a first electrode connection line and a second electrode connection line. The gate, the source and the drain are provided in the same layer and comprise the same material; the gate insulation layer is provided above the gate, the active layer is provided above the gate insulation layer, and a pattern of the gate insulation layer, a pattern of the gate and a pattern of the active layer coincide with each other; the passivation layer covers the source, the drain and the active layer, and the passivation layer has a first via hole corresponding to a position of the source, a second via hole corresponding to a position of the drain, and a third via hole and a fourth via hole corresponding to a position of the active layer provided therein; the first electrode connection line connects the source with the active layer through the first via hole and the third via hole, and the second electrode connection line connects the drain with the active layer through the second via hole and the fourth via hole.

The gate, the source, the drain, the active layer and the gate insulation layer of the low-temperature polysilicon thin film transistor in the present invention may be formed by one patterning process, and the first electrode connection line, the second electrode connection line, the first via hole, the second via hole, the third via hole and the fourth via hole may be formed by one patterning process. Therefore, the thin film transistor of the present invention may utilize only two patterning processes, and the fabricating process is simple.

The material of the gate, the source and the drain may comprise one or more of molybdenum, molybdenum niobium alloy, aluminum, aluminum neodymium alloy, titanium and copper.

The material of the gate insulation layer may comprise one or more of silicon oxide, silicon nitride, hafnium oxide, silicon oxynitride and aluminum oxide.

The embodiments of the present invention provide a method of fabricating a low-temperature polysilicon thin film transistor, comprising steps of: forming patterns comprising a gate, a source, a drain, a gate insulation layer and an active layer of the thin film transistor on a substrate by one patterning process, the gate, the source and the drain being provided in the same layer, the gate insulation layer being provided above the gate, the active layer being provided above the gate insulation layer, and the pattern of the gate, the pattern of the gate insulation layer and the pattern of the active layer coinciding with each other; forming a passivation layer on the substrate subjected to above step; and forming a first via hole corresponding to a position of the source, a second via hole corresponding to a position of the drain, and a third via hole and a fourth via hole corresponding to a position of the active layer in the passivation layer by patterning process, and forming a pattern of a first electrode connection line for connecting the source with the active layer through the first via hole and the third via hole and a pattern of a second electrode connection line for connecting the drain with the active layer through the second via hole and the fourth via hole.

In the method, the step of forming patterns comprising a gate, a source, a drain, a gate insulation layer and an active layer of the thin film transistor on a substrate by one patterning process comprises: sequentially depositing a metal film, a gate insulation layer film and an active layer film on the substrate, and coating a first photoresist layer on the active layer film; performing exposure and development on the first photoresist layer, so that a thickness of remaining photoresist corresponding to positions of the source and the drain is a first thickness, and a thickness of remaining photoresist corresponding to a position of the gate is a second thickness, the first thickness being smaller than the second thickness; removing exposed active layer film; removing exposed gate insulation layer film; removing exposed metal film; removing the photoresist with the first thickness; removing exposed active layer film; removing exposed gate insulation layer film; and removing remaining photoresist.

In the method, the step of forming the first via hole, the second via hole, the third via hole, the fourth via hole, the first electrode connection line and the second electrode connection line comprises: coating a second photoresist layer on the substrate on which the passivation layer is formed; performing exposure and development on the second photoresist layer, so that the photoresist corresponding to positions of the first via hole, the second via hole, the third via hole and the fourth via hole are removed, a thickness of remaining photoresist corresponding to positions of the first electrode connection line and the second electrode connection line is a third thickness, and a thickness of remaining photoresist at other regions is a fourth thickness, the third thickness being smaller than the fourth thickness; removing exposed passivation layer to form the first via hole, the second via hole, the third via hole and the fourth via hole; removing the photoresist with the third thickness; forming a conductive film; and removing remaining photoresist by stripping, while removing the conductive film on the photoresist, so as to form the first electrode connection line and the second electrode connection line.

The embodiments of the present invention provide an array substrate, comprising the above low-temperature polysilicon thin film transistor.

The array substrate may further comprise a pixel electrode and a pixel defining layer, the pixel electrode is connected with the second electrode connection line, the pixel electrode, the first electrode connection line and the second electrode connection line are provided in the same layer and comprise the same material; the pixel defining layer is provided above the pixel electrode.

The array substrate may further comprise a plurality of gate lines and a plurality of data lines intersecting with each other and insulated from each other, each gate line comprises a plurality of gate line strips and a third electrode connection line connecting two adjacent gate line strips in the gate line through fifth via holes penetrating through the passivation layer; the gate line strips, the data lines, the gate, the source and the drain are provided in the same layer and comprise the same material; the material of the third electrode connection line is the same as that of the pixel electrode.

The array substrate may further comprise a plurality of gate lines and a plurality of data lines intersecting with each other and insulated from each other, each data line comprises a plurality of data line strips and a fourth electrode connection line connecting two adjacent data line strips in the data line through sixth via holes penetrating through the passivation layer; the data line strips, the gate lines, the gate, the source and the drain are provided in the same layer and comprise the same material; the material of the fourth electrode connection line is the same as that of the pixel electrode.

Since the array substrate in the present invention comprises the above low-temperature polysilicon thin film transistor, the production cost of the array substrate is low, and the contact interface between the gate insulation layer and the active layer is improved so that the performance of the array substrate is good.

The embodiments of the present invention provide a method of fabricating an array substrate, comprising the above method of fabricating the low-temperature polysilicon thin film transistor.

In the method, a pattern of a pixel electrode that is connected with the second electrode connection line is formed while forming the first via hole, the second via hole, the third via hole, the fourth via hole, the first electrode connection line and the second electrode connection line.

The method may further comprise a step of forming a pattern of a pixel defining layer by patterning process on the substrate on which the pixel electrode is formed.

In the method, the step of forming the first via hole, the second via hole, the third via hole, the fourth via hole, the first electrode connection line, the second electrode connection line and the pixel electrode comprises: coating a second photoresist layer on the substrate on which the passivation layer is formed; performing exposure and development on the second photoresist layer, so that the photoresist corresponding to positions of the first via hole, the second via hole, the third via hole and the fourth via hole are removed, a thickness of remaining photoresist corresponding to positions of the first electrode connection line, the second electrode connection line and the pixel electrode is a third thickness, and a thickness of remaining photoresist at other regions is a fourth thickness, the third thickness being smaller than the fourth thickness; removing exposed passivation layer to form the first via hole, the second via hole, the third via hole and the fourth via hole; removing the photoresist with the third thickness; forming a conductive film; and removing remaining photoresist by stripping, while removing the conductive film on the photoresist, so as to form the first electrode connection line, the second electrode connection line and the pixel electrode.

In the method, the patterns of the gate line strips and the data lines are formed while forming the patterns comprising the gate, the source, the drain, the gate insulation layer and the active layer of the thin film transistor on the substrate by one patterning process, the gate line strips and the date lines are insulated from each other, the gate line strips, the data lines, the gate, the source and the drain are provided in the same layer and made of the same material; the fifth via holes for connecting two adjacent gate line strips at both sides of each data line are formed while forming the first via hole, the second via hole, the third via hole and the fourth via hole in the passivation layer by patterning process; the pattern of the third electrode connection line for connecting the two adjacent gate line strips through the fifth via holes are formed while forming the pixel electrode.

Alternatively, in the method, the patterns of the data line strips and the gate lines are formed while forming the patterns comprising the gate, the source, the drain, the gate insulation layer and the active layer of the thin film transistor on the substrate by one patterning process, the data line strips and the gate lines are insulated from each other, the data line strips, the gate lines, the gate, the source and the drain are provided in the same layer and made of the same material; the sixth via holes for connecting two adjacent data line strips at both sides of each gate line are formed while forming the first via hole, the second via hole, the third via hole and the fourth via hole in the passivation layer by patterning process; the pattern of the fourth electrode connection line for connecting the two adjacent data line strips through the sixth via holes are formed while forming the pixel electrode.

The array substrate of the present invention may be fabricated by three patterning processes, and the production cost of the array substrate is reduced.

The embodiments of the present invention provide a display device, comprising the above array substrate.

BRIEF DESCRIPTION OF THE DRAWINGS

FIG. 5 is a plan view of the array substrate of an embodiment of the present subject matter.

DESCRIPTION OF THE PREFERRED EMBODIMENT

To make those skilled in the art better understand the technical solutions of the present invention, the present invention will be further described below in detail in conjunction with the accompanying drawings and specific embodiments.

First Embodiment

Figure 1:
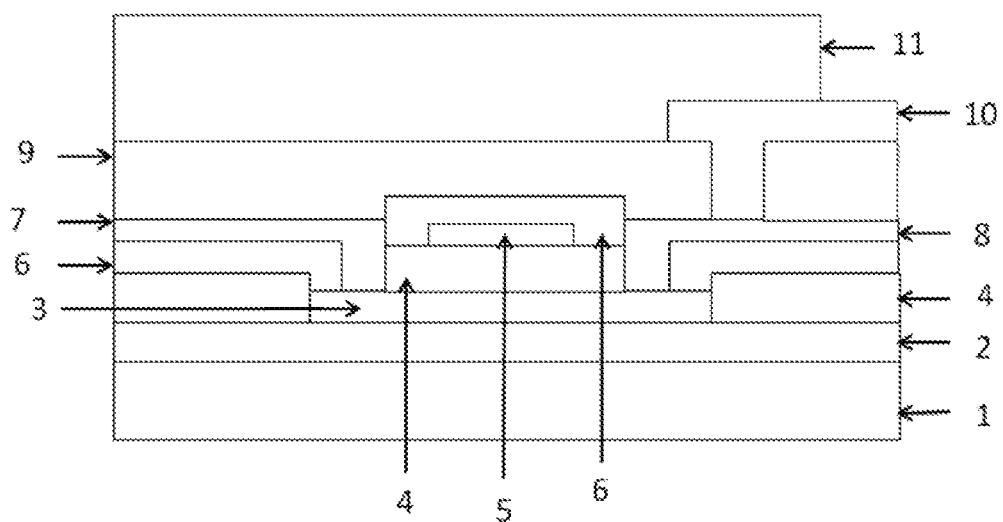
FIG. 1 is a schematic diagram of a structure of a low-temperature polysilicon array substrate in the prior art.
Figure 2A:
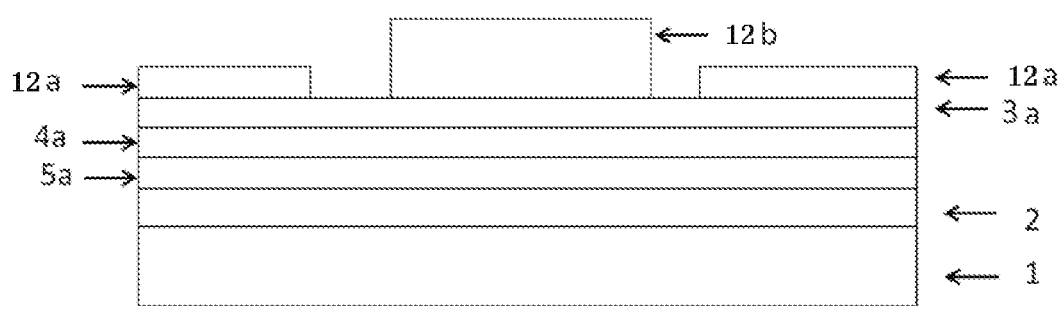
FIGS. 2a through 2d are schematic diagrams of a first photolithography process in methods of fabricating a low-temperature polysilicon thin film transistor and an array substrate of first and second embodiments of the present invention.
Figure 2B:
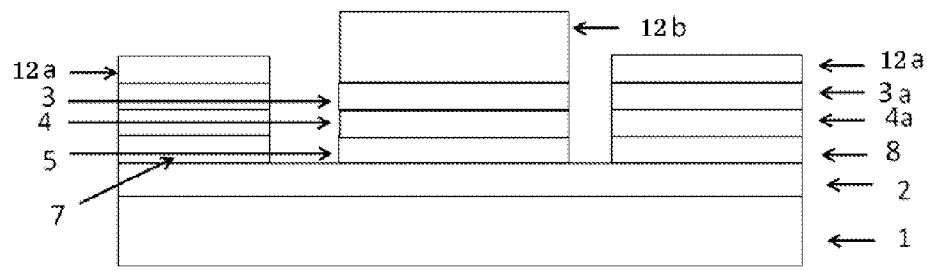
Figure 2C:
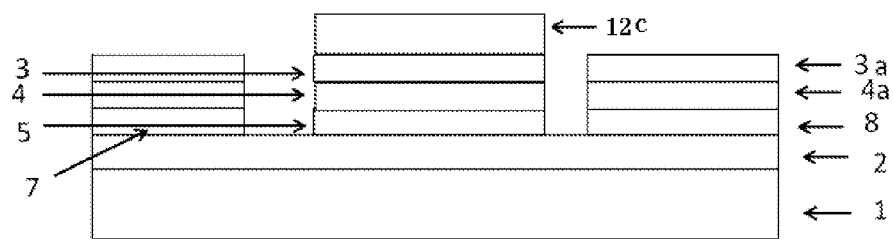
Figure 2D:
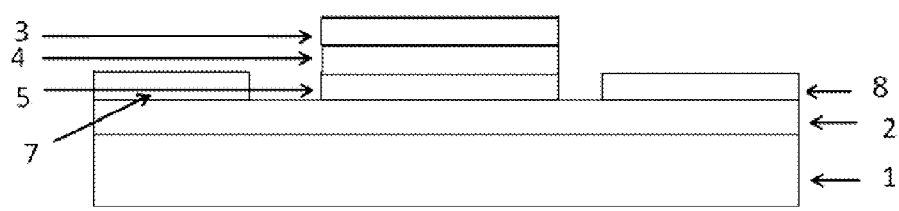
Figure 2E:
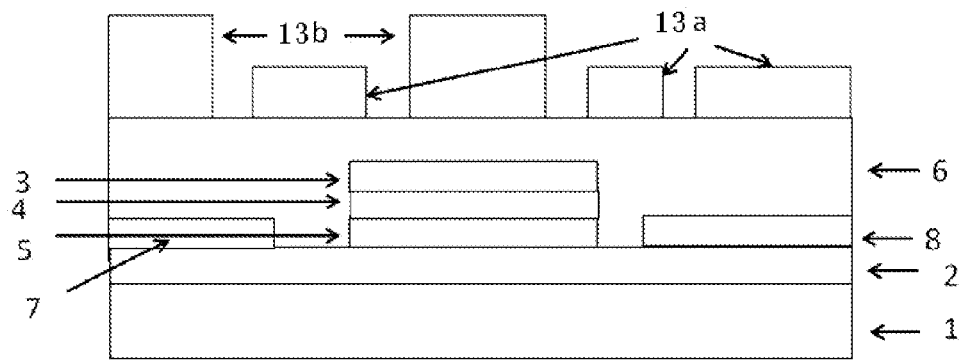
FIGS. 2e through 2i are schematic diagrams of a second photolithography process in the methods of fabricating the low-temperature polysilicon thin film transistor and the array substrate of first and second embodiments of the present invention.
Figure 2F:
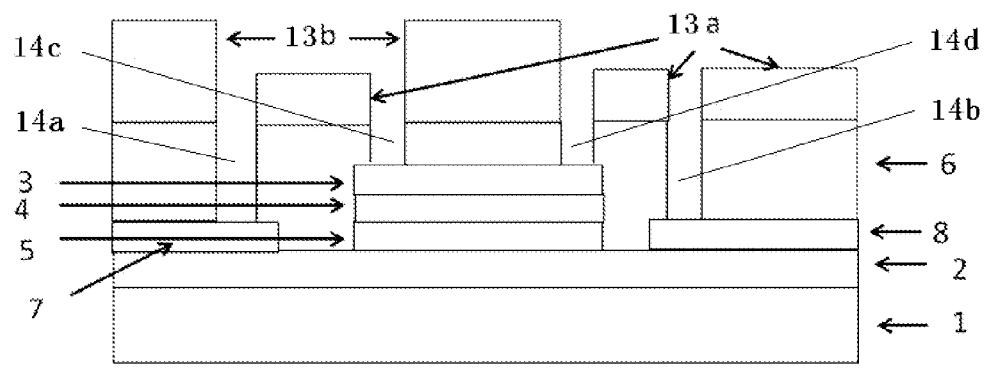
Figure 2G:
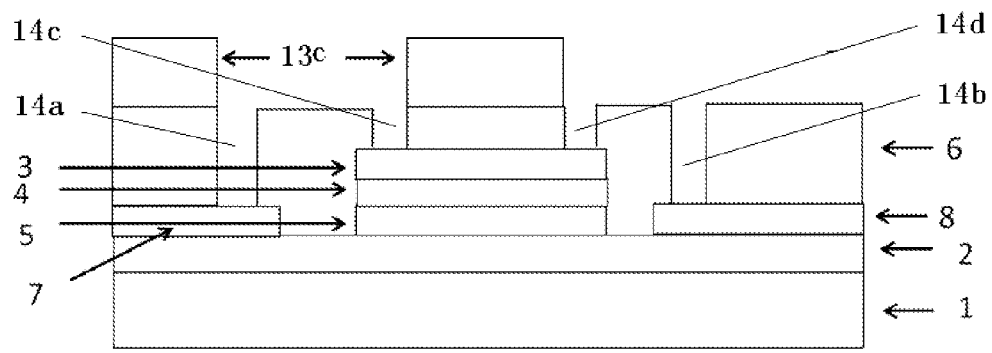
Figure 2H:
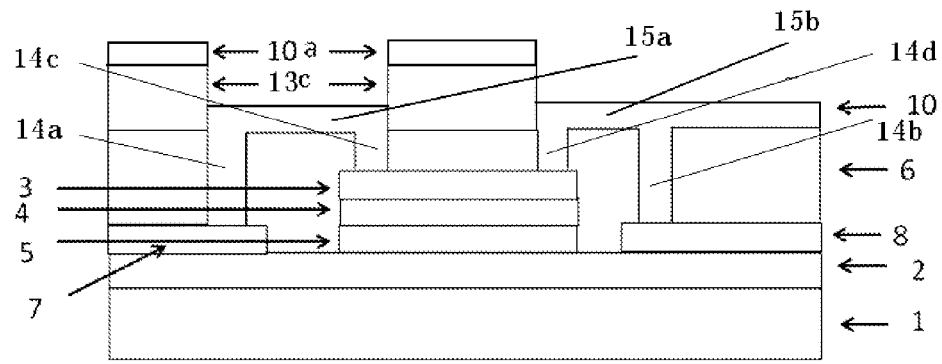
Figure 2I:
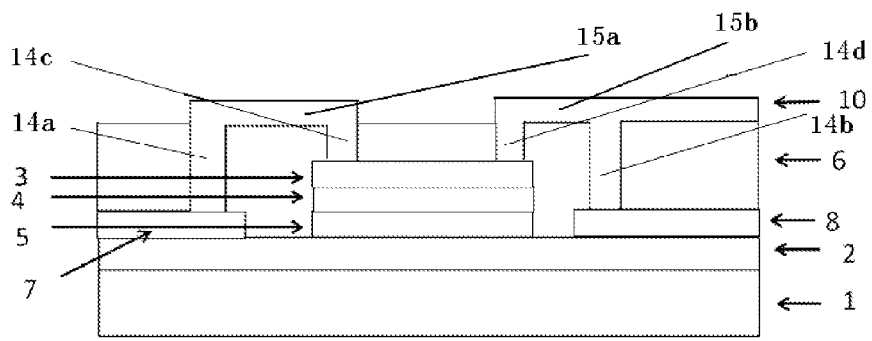

Referring to FIGS. 2a through 2i, the embodiment of the present invention provides a low-temperature polysilicon thin film transistor and a method of fabricating the same. Referring to FIG. 2i, the thin film transistor comprises a gate 5, a source 7, a drain 8, a gate insulation layer 4, an active layer 3, a passivation layer 6, a first electrode connection line 15a and a second electrode connection line 15b. In the thin film transistor, the gate 5, the source 7 and the drain 8 are provided in the same layer and comprise the same material; the gate insulation layer 4 is provided on the gate 5, the active layer 3 is provided on the gate insulation layer 4, a pattern of the gate insulation layer 4, a pattern of the gate 5 and a pattern of the active layer 3 coincide with each other; the passivation layer 6 covers the source 7, the drain 8 and the active layer 3, and the passivation layer 6 has a first via hole 14a corresponding to a position of the source 7, a second via hole 14b corresponding to a position of the drain 8, and a third via hole 14c and a fourth via hole 14d corresponding to a position of the active layer 3 provided therein; the first electrode connection line 15a connects the source 7 with the active layer 3 through the first via hole 14a and the third via hole 14c, and the second electrode connection line 15b connects the drain 8 with the active layer 3 through the second via hole 14b and the fourth via hole 14d.

Since the thin film transistor of the embodiment has the above structural features, the thin film transistor may be fabricated by two patterning processes, thereby improving production efficiency. Hereinafter, the method of fabricating the thin film transistor will be described in conjunction with FIGS. 2a through 2i.

First, an initial cleaning is performed on the substrate 1 to remove impurity particles on a surface of the substrate 1, and then a buffer layer 2 is formed by chemical vapor deposition (PECVD) on the substrate 1.

The buffer layer 2 may be a composite film structure of silicon nitride (SiN) film and silicon dioxide ($SiO_2$) film, a thickness of the silicon nitride film ranges from 50 nm to 100 nm, and a thickness of the silicon dioxide film ranges from 100 nm to 400 nm. The silicon nitride film has a strong diffusion barrier property and may restrain metal ions from affecting the polysilicon film. In addition, the silicon dioxide film has a good interface with the polysilicon film and may prevent defects of the silicon nitride film from degrading quality of the polysilicon film.

A layer of metal film 5a with a thickness ranging from 200 nm to 500 nm is deposited by magnetron sputtering on the substrate 1 subjected to above step. The metal film 5a may be a monolayer or multilayer composite film made of one or more of molybdenum (Mo), molybdenum niobium alloy (MoNb), aluminum (Al), aluminum neodymium alloy (AlNd), titanium (Ti) and copper (Cu), e.g., may be a monolayer or multilayer composite film consisting of Mo, Al or alloy containing Mo and Al.

A gate insulation layer film 4a is deposited by chemical vapor deposition on the metal film 5a, and the gate insulation layer film 4a may be a multilayer composite film consisting of one or more of silicon oxide (SiOx), silicon nitride (SiNx), hafnium oxide (HfOx), silicon oxynitride (SiON) and aluminum oxide (AlOx), e.g., may be a two-layered thin film having a layer of $SiO_2$ with a thickness ranging from 30 nm to 100 nm and a layer of SiN with a thickness ranging from 20 nm to 100 nm, in which the $SiO_2$ layer is a top layer and the SiN layer is a bottom layer.

A layer of a-Si (amorphous silicon) film with a thickness ranging from 40 nm to 100 nm is continuously deposited by chemical vapor deposition on the gate insulation layer film 4a to form an active layer film 3a. Dehydrogenation process is performed on the a-Si film by using thermal process, so as to prevent hydrogen explosion during crystallization. Then, a-Si crystallization process is performed, a polysilicon film shown in the drawing is formed by laser annealing crystallization, metal induced crystallization, solid phase crystallization or the like, and the polysilicon film is cleaned by using diluted hydrofluoric acid to reduce surface roughness of the polysilicon film, thereby reducing defects of the thin film transistor. A doping process is performed on the polysilicon film by using ion implantation process or ion cloud implantation process, so as to form an active region of the thin film transistor. In general, doping ions are $PH_3/H_2$ or $B_2H_6/H_2$, ion implantation dose ranges from $10^{11}$ ions/$cm^2$ to $10^{13}$ ions/$cm^2$, and implantation energy ranges from 10 KeV to 100 KeV. The doping process may effectively adjust a threshold voltage of the thin film transistor and improve a switching characteristic of the thin film transistor.

As shown in FIG. 2a, a first photoresist layer is formed on the polysilicon film, an exposure is performed on the photoresist layer by using a semi-transmissive mask plate, and a development is performed, so that the thickness of the remaining photoresist corresponding to positions of the source 7, the drain 8 is a first thickness 12a, and the thickness of the remaining photoresist corresponding to a position of the gate 5 is a second thickness 12b, the first thickness 12a is smaller than the second thickness 12b. For example, the semi-transmissive mask plate is a half-tone mask or a gray-tone mask.

As shown in FIG. 2b, exposed active layer film 3a is removed by plasma or inductively coupled plasma etching by using mixed gas such as $CF_4/O_2$, $CHF_3/O_2$, $SF_6/O_2$ or the like. Then, exposed gate insulation layer film 4a is removed by plasma or inductively coupled plasma etching by using gas such as $CF_4$, $CF_4/O_2$, $CHF_3/O_2$ or the like. A flow rate of the etching gas in this step is slightly different from that of the gas for etching the active layer film 3a, particularly $O_2$ is not required or a low flow rate of $O_2$ is required. And then, exposed metal film 5a is removed by etching, the etching process for the metal film may be a wet etching or a dry etching.

As shown in FIG. 2c, the photoresist layer with the first thickness 12a is removed by plasma ashing process, and accordingly, the thickness of the remaining photoresist on a region of an active layer 3 to be formed decreases to 12c.

As shown in FIG. 2d, by using above-mentioned methods, exposed active layer film 3a is removed, and exposed gate insulation layer film 4a is removed. Then, the remaining photoresist is removed by ashing, to form patterns comprising a gate 5, a source 7, a drain 8, a gate insulation layer 4 and an active layer 3.

As shown in FIG. 2e, a passivation layer 6 is formed on the substrate 1 subjected to above steps, a second photoresist layer is coated on the passivation layer 6, and exposure and development are performed on the photoresist layer, so that the photoresist corresponding to positions of a first via hole 14a, a second via hole 14b, a third via hole 14c and a fourth via hole 14d are removed, the thickness of the remaining photoresist corresponding to positions of a first electrode connection line 15a and a second electrode connection line 15b is a third thickness 13a, and the thickness of the remaining photoresist at other regions is a fourth thickness 13b, the third thickness 13a is smaller than the fourth thickness 13b.

As shown in FIG. 2f, exposed passivation layer 6 is removed by plasma or inductively coupled plasma etching by using $SF_6/O_2$/He gas, to form the first via hole 14a, the second via hole 14b, the third via hole 14c and the fourth via hole 14d.

As shown in FIG. 2g, the photoresist with the third thickness 13a is removed by plasma ashing process, and accordingly, the thickness of the photoresist at other regions decreases to 13c. For example, the thickness of the photoresist at a position between the third via hole 14c and the fourth via hole 14d and above the active layer 3 (i.e., the position above an active region of the active layer 3) becomes to 13c.

As shown in FIG. 2h, a conductive film 10a is formed by magnetron sputtering on the substrate 1 subjected to above steps. When the thin film transistor is applied to a bottom-emitting AMOLED, the conductive film 10a is a transparent oxide film, and generally, is a film made of material such as indium tin oxide (ITO), indium zinc oxide (IZO), zinc tin oxide (ZTO), etc., the thickness of which ranges from 20 nm to 100 nm. When the thin film transistor is applied to a top-emitting AMOLED, the conductive film 10a is generally a composite film made of material such as ITO/Ag/ITO, IZO/Ag, etc. For example, the thickness of the ITO film ranges from 10 nm to 50 nm, and the thickness of the Ag metal film ranges from 20 nm to 100 nm. Of course, as a general thin film transistor, the conductive film 10a may be a metal film having a good electric conductivity, for example, may be a monolayer or multilayer composite film made of one or more of molybdenum (Mo), molybdenum niobium alloy (MoNb), aluminum (Al), aluminum neodymium alloy (AlNd), titanium (Ti) and copper (Cu). The conductive film 10a may be a monolayer or multilayer composite film consisting of Mo, Al or alloy containing Mo and Al.

As shown in FIG. 2i, the substrate on which the conductive film 10a is deposited is placed into a stripping machine, the remaining photoresist is removed by using photoresist stripping solution, while the conductive film 10a deposited on the photoresist is removed by stripping process, so as to form the first electrode connection line 15a and the second electrode connection line 15b.

As can be seen from the above low-temperature polysilicon thin film transistor and method of fabricating the same, the method of fabricating the thin film transistor utilizes only two photolithography processes, thereby significantly reducing the production cost. The thin film transistor is a thin film transistor with bottom-gate structure, so that the rough upper surface of the polysilicon film is in contact with the passivation layer 6, and the smooth lower surface of the polysilicon film constitutes the interface that is in contact with the gate insulation layer 4, so that the thin film transistor has less interface defects and better transistor characteristics.

Second Embodiment

This embodiment provides an array substrate and a method of fabricating the same, and the array substrate comprises the thin film transistor described in the first embodiment.

Figure 2J:
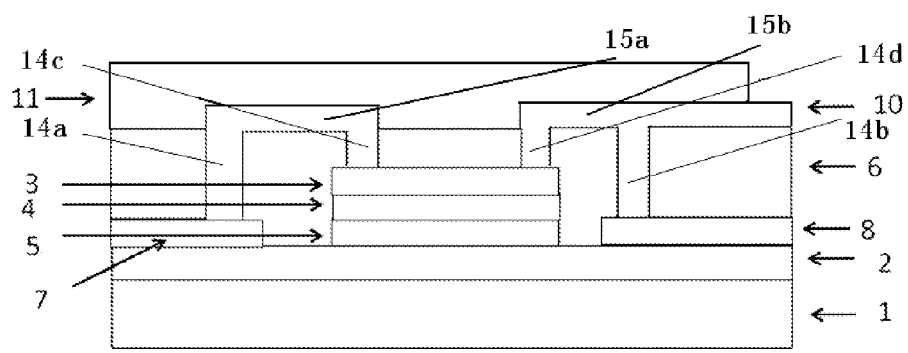
FIG. 2j is a schematic diagram of a third photolithography process in the method of fabricating the array substrate of the second embodiment of the present invention.

As shown in FIG. 2j, the array substrate of the embodiment further comprises a pixel electrode 10 and a pixel defining layer 11. The pixel electrode 10, the first electrode connection line 15a and the second electrode connection line 15b are provided in the same layer and comprise the same material. Therefore, the pixel electrode 10, the first electrode connection line 15a and the second electrode connection line 15b of the embodiment may be formed by one patterning process.

Figure 3:
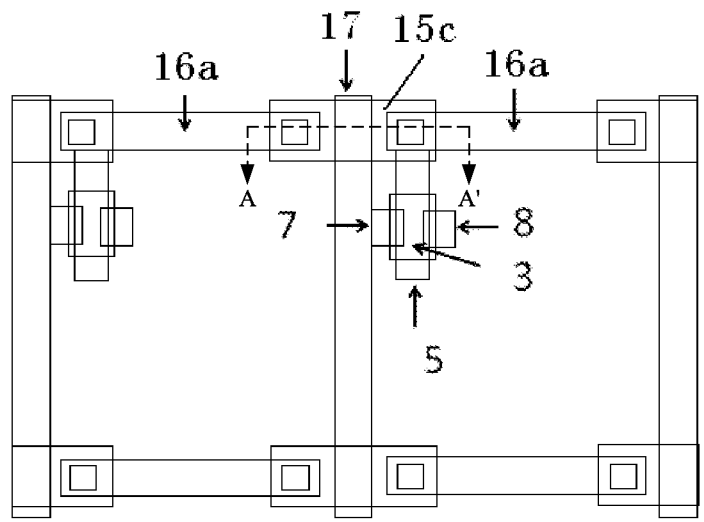
FIG. 3 is a plan view of the array substrate of the embodiment of the present invention.
Figure 4:
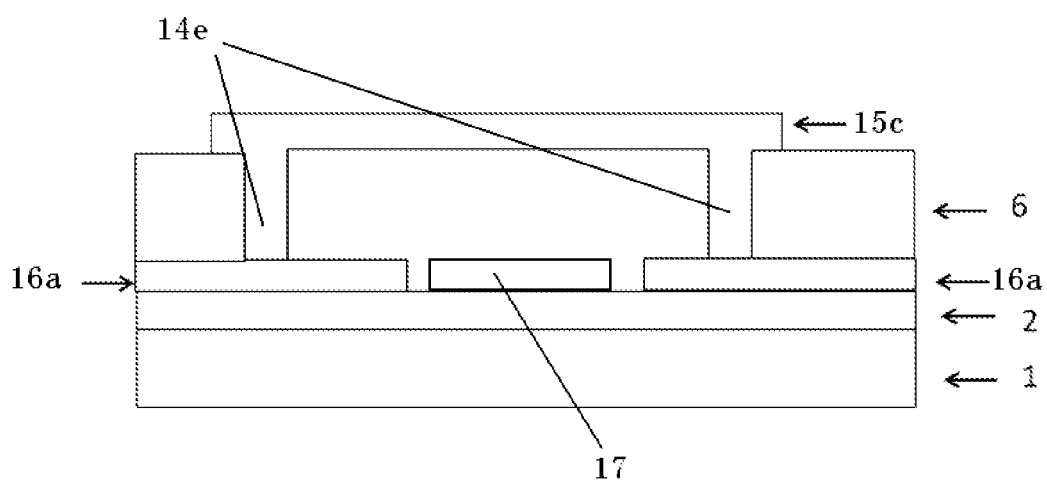
FIG. 4 is a cross sectional view taken along line A-A' in FIG. 3.

As shown in FIGS. 3 and 4, as one case of the embodiment, the array substrate further comprises a plurality of gate lines and a plurality of data lines 17 intersecting with each other and insulated from each other, each gate line comprises a plurality of gate line strips 16a and a third electrode connection line 15c connecting two adjacent gate line strips 16a in the gate line through fifth via holes 14e penetrating through the passivation layer 6. The gate line strips 16a, the data lines 17, the gate 5, the source 7 and the drain 8 are provided in the same layer and comprise the same material. The material of the third electrode connection line 15c is the same as that of the pixel electrode 10. Therefore, in this case of the embodiment, the gate line strips 16a, the data lines 17, the gate 5, the source 7 and the drain 8 may be formed by one patterning process, and the third electrode connection line 15c, the first electrode connection line 15a, the second electrode connection line 15b and the pixel electrode 10 may be formed by one patterning process.

It should be noted that, in this case, the objective of forming the gate line strips 16a rather than forming each complete gate line is to avoid a short circuit between the gate lines and the data lines 17 provided in the same layer due to overlapping.

As another case of the embodiment, such as in FIG. 5, the array substrate further comprises a plurality of gate lines and a plurality of data lines intersecting with each other and insulated from each other, each data line comprises a plurality of data line strips and a fourth electrode connection line connecting two adjacent data line strips in the data line through sixth via holes penetrating through the passivation layer 6. The data line strips, the gate lines, the gate 5, the source 7 and the drain 8 are provided in the same layer and comprise the same material. The material of the fourth electrode connection line is the same as that of the pixel electrode 10. Therefore, in this case of the embodiment, the data line strips, the gate lines, the gate 5, the source 7 and the drain 8 may be formed by one patterning process, and the fourth electrode connection line, the first electrode connection line 15a, the second electrode connection line 15b and the pixel electrode 10 may be formed by one patterning process.

It should be noted that, in this case, the objective of forming the data line strips rather than forming each complete data line is to avoid a short circuit between the gate lines and the data lines provided in the same layer due to overlapping.

The embodiment further provides a method of fabricating the array substrate, and the method comprises the method of fabricating the thin film transistor in the first embodiment. Hereinafter, the method of fabricating the array substrate in the embodiment will be described.

First, an initial cleaning is performed on the substrate 1 to remove impurity particles on a surface of the substrate 1, and then a buffer layer 2 is formed by chemical vapor deposition (PECVD) on the substrate 1.

The buffer layer 2 may be a composite film structure of silicon nitride (SiN) film and silicon dioxide (SiO2) film, a thickness of the silicon nitride film ranges from 50 nm to 100 nm, and a thickness of the silicon dioxide film ranges from 100 nm to 400 nm. The silicon nitride film has a strong diffusion barrier property and may restrain metal ions from affecting the polysilicon film. In addition, the silicon dioxide film has a good interface with the polysilicon film and may prevent defects of the silicon nitride film from degrading quality of the polysilicon film.

A layer of metal film 5a with a thickness ranging from 200 nm to 500 nm is deposited by magnetron sputtering on the substrate 1 subjected to above step. The metal film 5a may be a monolayer or multilayer composite film made of one or more of molybdenum (Mo), molybdenum niobium alloy (MoNb), aluminum (Al), aluminum neodymium alloy (AlNd), titanium (Ti) and copper (Cu), e.g., may be a monolayer or multilayer composite film consisting of Mo, Al or alloy containing Mo and Al.

A gate insulation layer film 4a is deposited by chemical vapor deposition on the metal film 5a, and the gate insulation layer film 4a may be a multilayer composite film consisting of one or more of silicon oxide (SiOx), silicon nitride (SiNx), hafnium oxide (HfOx), silicon oxynitride (SiON) and aluminum oxide (AlOx), e.g., may be a two-layered thin film having a layer of $SiO_2$ with a thickness ranging from 30 nm to 100 nm and a layer of SiN with a thickness ranging from 20 nm to 100 nm, in which the $SiO_2$ layer is a top layer and the SiN layer is a bottom layer.

A layer of a-Si (amorphous silicon) film with a thickness ranging from 40 nm to 100 nm is continuously deposited by chemical vapor deposition on the gate insulation layer film 4a to form an active layer film 3a. Dehydrogenation process is performed on the a-Si film by using thermal process, so as to prevent hydrogen explosion during crystallization. Then, a-Si crystallization process is performed, a polysilicon film shown in the drawing is formed by laser annealing crystallization, metal induced crystallization, solid phase crystallization or the like, and the polysilicon film is cleaned by using diluted hydrofluoric acid to reduce surface roughness of the polysilicon film, thereby reducing defects of the thin film transistor. A doping process is performed on the polysilicon film by using ion implantation process or ion cloud implantation process, so as to form an active region of the thin film transistor. In general, doping ions are $PH_3/H_2$ or $B_2H_6/H_2$, ion implantation dose ranges from $10^{11}$ ions/cm$^2$ to $10^{13}$ ions/cm$^2$, and implantation energy ranges from 10 KeV to 100 KeV. The doping process may effectively adjust a threshold voltage of the thin film transistor and improve a switching characteristic of the thin film transistor.

Referring to FIG. 2a, a first photoresist layer is formed on the polysilicon film, an exposure is performed on the photoresist layer by using a semi-transmissive mask plate, and a development is performed, so that the thickness of the remaining photoresist corresponding to positions of the source 7, the drain 8, the data lines 17 and the gate line strips 16a is a first thickness 12a, and the thickness of the remaining photoresist corresponding to a position of the gate 5 is a second thickness 12b, the first thickness 12a is smaller than the second thickness 12b. For example, the semi-transmissive mask plate is a half-tone mask or a gray-tone mask.

As shown in FIG. 2b, exposed active layer film 3a is removed by plasma or inductively coupled plasma etching by using mixed gas such as $CF_4/O_2$, $CHF_3/O_2$, $SF_6/O_2$ or the like. Then, exposed gate insulation layer film 4a is removed by plasma or inductively coupled plasma etching by using gas such as $CF_4$, $CF_4/O_2$, $CHF_3/O_2$ or the like. A flow rate of the etching gas in this step is slightly different from that of the gas for etching the active layer film 3a, particularly $O_2$ is not required or a low flow rate of $O_2$ is required. And then, exposed metal film 5a is removed by etching, the etching process for the metal film may be a wet etching or a dry etching.

As shown in FIG. 2c, the photoresist layer with the first thickness 12a is removed by plasma ashing process, and accordingly, the thickness of the remaining photoresist above a region of an active layer 3 to be formed decreases to 12c.

Referring to FIG. 2d, by using above-mentioned methods, exposed active layer film 3a is removed, and exposed gate insulation layer film 4a is removed. Then, the remaining photoresist is removed by ashing, to form patterns comprising a gate 5, a source 7, a drain 8, data lines 17, gate line strips 16a, a gate insulation layer 4 and an active layer 3.

As shown in FIG. 2e, a passivation layer 6 is formed on the substrate 1 subjected to above steps, a second photoresist layer is coated on the passivation layer 6, and exposure and development are performed on the photoresist layer, so that the photoresist corresponding to positions of a first via hole 14a, a second via hole 14b, a third via hole 14c, a fourth via hole 14d and a fifth via hole 14e are removed, the thickness of the remaining photoresist corresponding to positions of a first electrode connection line 15a, a second electrode connection line 15b, a third electrode connection line 15c and a pixel electrode 10 is a third thickness 13a, and the thickness of the remaining photoresist at other regions is a fourth thickness 13b, the third thickness 13a is smaller than the fourth thickness 13b.

As shown in FIG. 2f, exposed passivation layer 6 is removed by plasma or inductively coupled plasma etching by using $SF_6/O_2/He$ gas, to form the first via hole 14a, the second via hole 14b, the third via hole 14c, the fourth via hole 14d and the fifth via hole 14e.

As shown in FIG. 2g, the photoresist with the third thickness 13a is removed by plasma ashing process, and accordingly, the thickness of the photoresist at other regions decreases to 13c. For example, the thickness of the photoresist at a position between the third via hole 14c and the fourth via hole 14d and above the active layer 3 (i.e., the position above an active region of the active layer 3) becomes to 13c.

As shown in FIG. 2h, a conductive film 10a is formed by magnetron sputtering on the substrate 1 subjected to above steps. When the thin film transistor is applied to a bottom-emitting AMOLED, the conductive film 10a is a transparent oxide film, and generally, is a film made of material such as indium tin oxide (ITO), indium zinc oxide (IZO), zinc tin oxide (ZTO), etc., the thickness of which ranges from 20 nm to 100 nm. When the thin film transistor is applied to a top-emitting AMOLED, the conductive film 10a is generally a composite film made of material such as ITO/Ag/ITO, IZO/Ag, etc. For example, the thickness of the ITO film ranges from 10 nm to 50 nm, and the thickness of the Ag metal film ranges from 20 nm to 100 nm.

As shown in FIG. 2i, the substrate on which the conductive film 10a is deposited is placed into a stripping machine, the remaining photoresist is removed by using photoresist stripping solution, while the conductive film 10a deposited on the photoresist is removed by stripping process, so as to form the first electrode connection line 15a, the second electrode connection line 15b, the third electrode connection line 15c and the pixel electrode 10.

As shown in FIG. 2j, a pattern comprising a pixel defining layer 11 is formed by patterning process. The material of the pixel defining layer 11 may be Acrylic, polyimide (PI), etc., and the thickness of the pixel defining layer 11 ranges from 1 μm to 4 μm.

It should be noted that, the above steps are described by taking formation of the gate line strips 16a as an example. Of course, formation of the data line strips and each complete gate line is also possible.

Specifically, sixth via holes for connecting two adjacent data line strips in each data line are formed while the first via hole 14a, the second via hole 14b, the third via hole 14c and the fourth via hole 14d are formed by patterning process in the passivation layer 6. In addition, a pattern of a fourth electrode connection line for connecting two adjacent data line strips in each data line through the sixth via holes are formed while the pixel electrode 10 is formed.

Third Embodiment

This embodiment provides a display device that comprises the array substrate in the second embodiment.

The display device may be any product or component with a display function, such as mobile phone, tablet computer, TV set, display, notebook computer, digital photo frame, navigator, etc.

Of course, the display device of the embodiment may further comprise other conventional structure such as display driving unit, etc.

It could be understood that, the above implementations are merely exemplary embodiments adopted for illustrating the principle of the present invention, but the present invention is not limited thereto. Various variations and improvements may be made for those of ordinary skill in the art without departing from the spirit and essence of the present invention, and these variations and improvements are deemed to fall within the protection scope of the present invention.

The invention claimed is:
1. A method of fabricating a low-temperature polysilicon thin film transistor, comprising steps of:
    forming patterns comprising a gate, a source, a drain, a gate insulation layer and an active layer of the thin film transistor on a substrate, the gate, the source and the drain being provided in the same layer, the gate insulation layer being provided on the gate, the active layer being provided on the gate insulation layer, and the pattern of the gate, the pattern of the gate insulation layer and the pattern of the active layer coinciding with each other;

forming a passivation layer on the substrate subjected to above step; and forming a first via hole corresponding to a position of the source, a second via hole corresponding to a position of the drain, and a third via hole and a fourth via hole corresponding to a position of the active layer in the passivation layer by patterning process, and forming a pattern of a first electrode connection line for connecting the source with the active layer through the first via hole and the third via hole and a pattern of a second electrode connection line for connecting the drain with the active layer through the second via hole and the fourth via hole, wherein the step of forming patterns comprising a gate, a source, a drain, a gate insulation layer and an active layer of the thin film transistor on a substrate is performed by using one patterning process and comprises:

sequentially depositing a metal film, a gate insulation layer film and an active layer film on the substrate, and coating a first photoresist layer on the active layer film;

performing exposure and development on the first photoresist layer, so that a thickness of remaining photoresist corresponding to positions of the source and the drain is a first thickness, and a thickness of remaining photoresist corresponding to a position of the gate is a second thickness, the first thickness being smaller than the second thickness;

removing exposed active layer film;

removing exposed gate insulation layer film;

removing exposed metal film;

removing the photoresist with the first thickness;

removing exposed active layer film;

removing exposed gate insulation layer film; and removing remaining photoresist.

2. The method of fabricating the low-temperature polysilicon thin film transistor of claim 1, wherein the step of forming the first via hole, the second via hole, the third via hole, the fourth via hole, the first electrode connection line and the second electrode connection line comprises:

coating a second photoresist layer on the substrate on which the passivation layer is formed;

performing exposure and development on the second photoresist layer, so that the photoresist corresponding to positions of the first via hole, the second via hole, the third via hole and the fourth via hole are removed, a thickness of remaining photoresist corresponding to positions of the first electrode connection line and the second electrode connection line is a third thickness, and a thickness of remaining photoresist at other regions is a fourth thickness, the third thickness being smaller than the fourth thickness;

removing exposed passivation layer to form the first via hole, the second via hole, the third via hole and the fourth via hole;

removing the photoresist with the third thickness;

forming a conductive film; and removing remaining photoresist by stripping, while removing the conductive film on the photoresist, so as to form the first electrode connection line and the second electrode connection line.

3. An array substrate, comprising a low-temperature polysilicon thin film transistor, the low-temperature polysilicon thin film transistor comprises a gate, a source, a drain, a gate insulation layer, an active layer, a passivation layer, a first electrode connection line and a second electrode connection line, wherein the gate, the source and the drain are provided in the same layer and comprise the same material;

the gate insulation layer is provided on the gate, the active layer is provided on the gate insulation layer, and a pattern of the gate insulation layer, a pattern of the gate and a pattern of the active layer coincide with each other;

the passivation layer covers the source, the drain and the active layer, and the passivation layer has a first via hole corresponding to a position of the source, a second via hole corresponding to a position of the drain, and a third via hole and a fourth via hole corresponding to a position of the active layer provided therein; and the first electrode connection line connects the source with the active layer through the first via hole and the third via hole, and the second electrode connection line connects the drain with the active layer through the second via hole and the fourth via hole, the array substrate further comprises a pixel electrode and a pixel defining layer, wherein the pixel electrode is connected with the second electrode connection line, the pixel electrode, the first electrode connection line and the second electrode connection line are provided in the same layer and comprise the same material;

the pixel defining layer is provided above the pixel electrode, and the array substrate further comprises a plurality of gate lines and a plurality of data lines intersecting with each other and insulated from each other, wherein each gate line is divided into a plurality of segments and comprises a third electrode connection line connecting two adjacent segments of the gate line through fifth via holes penetrating through the passivation layer;

the gate lines, the data lines, the gate, the source and the drain are provided in the same layer and comprise the same material; and the material of the third electrode connection line is the same as that of the pixel electrode.

4. The array substrate of claim 3, wherein each data line is divided into a plurality of segments and comprises a fourth electrode connection line connecting two adjacent segments of the data line through sixth via holes penetrating through the passivation layer; and the material of the fourth electrode connection line is the same as that of the pixel electrode.

5. A method of fabricating an array substrate, comprising a method of fabricating a low-temperature polysilicon thin film transistor, the method of fabricating a low-temperature polysilicon thin film transistor comprising steps of:

forming patterns comprising a gate, a source, a drain, a gate insulation layer and an active layer of the thin film transistor on a substrate, the gate, the source and the drain being provided in the same layer, the gate insulation layer being provided on the gate, the active layer being provided on the gate insulation layer, and the pattern of the gate, the pattern of the gate insulation layer and the pattern of the active layer coinciding with each other;

forming a passivation layer on the substrate subjected to above step; and forming a first via hole corresponding to a position of the source, a second via hole corresponding to a position of the drain, and a third via hole and a fourth via hole corresponding to a position of the active layer in the passivation layer by patterning process, and forming a pattern of a first electrode connection line for connecting the source with the active layer through the first via hole and the third via hole and a pattern of a second electrode connection line for connecting the drain with the active layer through the second via hole and the fourth via hole, wherein a pattern of a pixel electrode that is connected with the second electrode connection line is formed while forming the first via hole, the second via hole, the third via hole, the fourth via hole, the first electrode connection line and the second electrode connection line.

6. The method of fabricating the array substrate of claim 5, further comprising a step of: forming a pattern of a pixel defining layer by patterning process on the substrate on which the pixel electrode is formed.

7. The method of fabricating the array substrate of claim 5, wherein the step of forming the first via hole, the second via hole, the third via hole, the fourth via hole, the first electrode connection line, the second electrode connection line and the pixel electrode comprises:

coating a second photoresist layer on the substrate on which the passivation layer is formed;

performing exposure and development on the second photoresist layer, so that the photoresist corresponding to positions of the first via hole, the second via hole, the third via hole and the fourth via hole are removed, a thickness of remaining photoresist corresponding to positions of the first electrode connection line, the second electrode connection line and the pixel electrode is a third thickness, and a thickness of remaining photoresist at other regions is a fourth thickness, the third thickness being smaller than the fourth thickness;

removing exposed passivation layer to form the first via hole, the second via hole, the third via hole and the fourth via hole;

removing the photoresist with the third thickness;

forming a conductive film; and removing remaining photoresist by stripping, while removing the conductive film on the photoresist, so as to form the first electrode connection line, the second electrode connection line and the pixel electrode.

8. A method of fabricating an array substrate, comprising a method of fabricating a low-temperature polysilicon thin film transistor, the method of fabricating a low-temperature polysilicon thin film transistor comprising steps of:

forming patterns comprising a gate, a source, a drain, a gate insulation layer and an active layer of the thin film transistor on a substrate, the gate, the source and the drain being provided in the same layer, the gate insulation layer being provided on the gate, the active layer being provided on the gate insulation layer, and the pattern of the gate, the pattern of the gate insulation layer and the pattern of the active layer coinciding with each other;

forming a passivation layer on the substrate subjected to above step; and forming a first via hole corresponding to a position of the source, a second via hole corresponding to a position of the drain, and a third via hole and a fourth via hole corresponding to a position of the active layer in the passivation layer by patterning process, and forming a pattern of a first electrode connection line for connecting the source with the active layer through the first via hole and the third via hole and a pattern of a second electrode connection line for connecting the drain with the active layer through the second via hole and the fourth via hole, wherein patterns of gate lines and data lines are formed while forming the patterns comprising the gate, the source, the drain, the gate insulation layer and the active layer of the thin film transistor on the substrate, the gate lines and the data lines are insulated from each other, the gate lines, the data lines, the gate, the source and the drain are provided in the same layer and made of the same material, and each gate line is divided into a plurality of segments;

fifth via holes for connecting two adjacent segments of the gate line at both sides of each data line are formed while forming the first via hole, the second via hole, the third via hole and the fourth via hole in the passivation layer by patterning process; and a pattern of a third electrode connection line for connecting the two adjacent segments of the gate line through the fifth via holes is formed while forming the pixel electrode.

9. The method of fabricating the array substrate of claim 8, wherein each data line is divided into a plurality of segments;

sixth via holes for connecting two adjacent segments of the data line at both sides of each gate line are formed while forming the first via hole, the second via hole, the third via hole and the fourth via hole in the passivation layer by patterning process; and a pattern of a fourth electrode connection line for connecting the two adjacent segments of the data line through the sixth via holes is formed while forming the pixel electrode.

10. A display device, comprising the array substrate of claim 3.

* * * * *